United States Patent [19]

Johnson et al.

[11] Patent Number: 4,552,206

[45] Date of Patent: Nov. 12, 1985

[54] HEAT SINKS FOR INTEGRATED CIRCUIT MODULES

[75] Inventors: Philip A. Johnson, Kingston; Alfred F. McCarthy, Belmount, both of N.H.

[73] Assignee: Aavid Engineering, Inc., Laconia, N.H.

[21] Appl. No.: 458,322

[22] Filed: Jan. 17, 1983

[51] Int. Cl.[4] ............................................. H01L 23/02
[52] U.S. Cl. .................................... 165/80.3; 357/81; 357/79; 165/185
[58] Field of Search .................. 165/80 B, 80 D, 185; 357/81, 79, 82; 361/381, 383, 386, 388

[56] References Cited

U.S. PATENT DOCUMENTS

| 3,548,927 | 12/1970 | Spurling | 165/80 B |
| 4,222,090 | 9/1980 | Jafte | 165/80 B |
| 4,235,285 | 11/1980 | Johnson et al. | 165/80 B |
| 4,408,220 | 10/1983 | Calabro | 165/80 B |

Primary Examiner—William R. Cline

Attorney, Agent, or Firm—James E. Mrose

[57] ABSTRACT

In dissipating heat from miniature electronic devices, circuit modules, or the like, and particularly from dual-in-line package (DIP) type units having leads depending from opposite sides of a thin molded rectangular-parallelepiped body, an elongated sheet-metal strip of heat-radiating elements disposed above and in spaced relation to the top of the package has its opposite ends integrally connected with separate spaced heat-conducting clip members which are cantilevered from it in different directions to fit respectively about the top and bottom surfaces of the package and to flex so as to accommodate insertion of the package between them and yet adjust themselves into desirable broad-area abutments with those surfaces. Heat conducted away from the package by each of the cantilevered members first reaches a different end of the strip of heat-radiating elements, without coursing through the other member and without interfering with the heat-exchange taking place along the opposite surfaces of the package clipped between the members.

1 Claim, 7 Drawing Figures

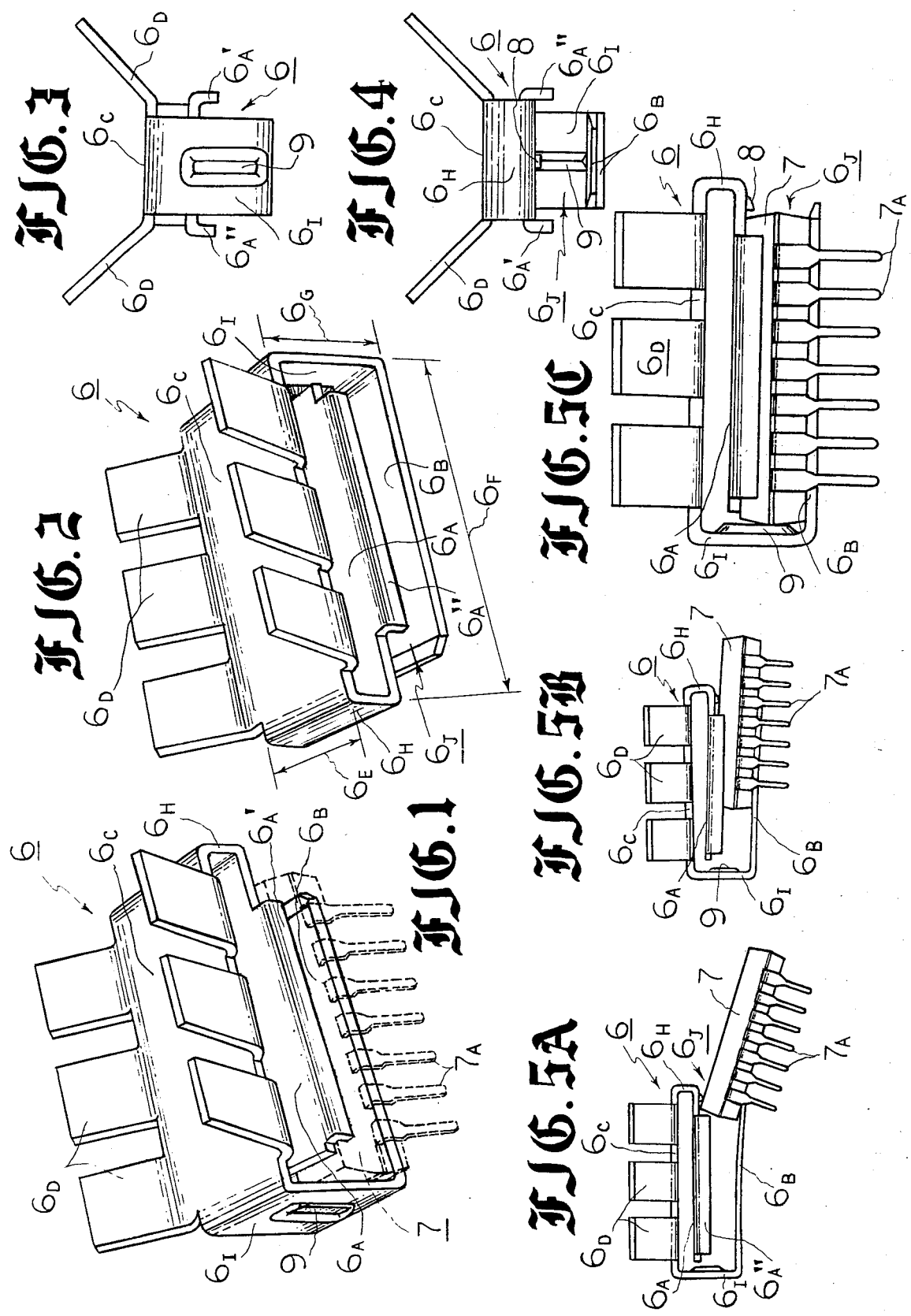

HEAT SINKS FOR INTEGRATED CIRCUIT MODULES

BACKGROUND OF THE INVENTION

The present invention relates to improvements in provisions for dissipating heat from miniature electrical packages of components or devices, and, in one particular aspect, to novel and advantageous stamped-metal heat sinks of economical construction which readily accept and securely attach themselves in efficient heat-exchange relationships to modules of the dual-in-line package type, with improved release of unwanted thermal energy to ambient environment being effected by a broad-area radiating member held in favorably-spaced relation to the package by integral springclip members uniquely arranged to flex into intimate engagements with opposed surfaces of the package and which separately and without interference with one another conduct heat from those surfaces to the main radiating member.

Miniature electrical and electronic units, such as those in which devices or components or circuits are packaged in molded modular form for automated interconnections in printed-circuit board environments, commonly have power-handling limitations which are largely determined by their abilities to expel internally-generated heat and thereby avoid general or localized thermal degradations or failures within them. Performance of such units can often be very significantly extended or enlarged with the aid of finned metal extrusions or stampings which will conduct and radiate heat away from thermally-vulnerable regions, thereby upgrading relatively low-cost items into more demanding and valuable service than their uncooled ratings would otherwise allow. Some units, and notably those of the dual-in-line package (DIP) type, have both upper and lower broad-area surfaces from which heat should best be extracted efficiently if the units are to operate safely nearer theoretical peaks of performance. It has been known to form the cover of the sealed enclosure of a semiconductor package as an integral heat-radiating member, and to enhance the flow of heat from at least the top of the package by way of a pillow in which a thermally-conductive material is contained by a film (U.S. Pat. No. 4,092,697). And, in situations where the package is to be cooled with the aid of accessory heat-sink attachments, it has been proposed that a winged sheet-metal radiator be held on top of an integrated-circuit package by pairs of fingers struck from the same metal and disposed to grasp edges of the package; more secure fastening has also been available through soldering of special tabs and fingers of the mated items (U.S. Pat. No. 3,670,215). Along the latter lines, it has also been a practice to bond lightweight heat-radiators directly to the top of a package, using an adhesive which conducts well. More conveniently, however, and offering more efficient broad-area contacting as well, a small sheet-metal heat-sink is fashioned either as a one-part or two-part spring clip which fits not only along the top of an elongated package but also fully along the bottom, where commonly the greater heat build-up tends to occur and yet where there is little space available between the bottom of the package and the confronting top surface of a printed-circuit board on which the package is mounted. Our joint U.S. Pat. Nos. 4,203,488 and 4,235,285 disclose such clip-type heat sinks. In some instances, mechanical locking of a spring-clip heat sink may be adequately provided with the aid of detenting, such as is described in connection with the tab-engaging units in U.S. Pat. Nos. 3,893,161 and 4,012,769; in other cases, the clasp end of a clip unit such as is featured in our said U.S. Pat. No. 4,235,285 may simply be omitted and the unit permitted to yieldably clamp itself in place.

As appears more fully hereinafter, a unique and advantageous arrangement for withdrawing and dissipating excess thermal energy from small electronic packages or modules includes a self-fastening clip unit in which two heat-conducting elements engage opposite surfaces of such a package and independently conduct heat away from it to a third integral element which effects an efficient release of such heat to the surrounding or ambient atmosphere. That folded-back arrangement of elements bears some superficial resemblance to a prior resilient accessory clip used to press a separated fingered heat-dissipation member into intimate contact with a component which is to be cooled (U.S. Pat. No. 3,548,927), but it will be appreciated that the clip there is not itself a primary heat-dissipating device and it functions instead as a mere resilient clamp for a component and dissipator.

SUMMARY OF THE INVENTION

The present invention is aimed at providing miniature self-fastened heat sinks which are especially useful in the cooling of dual-in-line (DIP) integrated-circuit (IC) packages, or the like, and which lend themselves to economical manufacture, to ease and convenience of assembly into place, and to efficient non-interfering transfers of heat away from broad areas of both top and bottom surfaces of such packages. In one preferred embodiment, a stamped sheet-metal heat sink, of a material which has a sufficient degree of resilience for the intended purposes, is fashioned as a spring clip having three folded sections. An elongated middle section, from the ends of which two other integral elongated sections are cantilevered and folded back in parallel, acts as the principal heat radiator and, for that purpose, is held by the other two sections in a stand-off spaced relation to a package clasped between those sections. Preferably, the middle section bristles with fins or has other provisions for broad-area interfacing or thermal matching with ambient atmosphere. The two end sections are so cantilevered and folded back in opposite directions from extremities of the middle section that they both lie to one side of it and are normally in a substantially parallel relationship complementing that of the top and bottom surfaces of the package which they are designed to abut and clasp between them; heat is therefore conducted away from those surfaces along independent paths to the middle heat-dissipating section.

Accordingly, it is one of the objects of this invention to provide novel and improved clasp-type heat sinks, for attachment to miniature integrated-circuitry packages or the like, which efficiently conduct heat from both top and bottom surfaces of such packages independently to a common heat-radiating structure.

A further object is to provide unique and advantageous self-fastening heat sinks of low-cost sheet-metal construction which lend themselves to uncomplicated mating with and efficient withdrawal and dissipations of heat from DIP circuit modules and the like.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

FIG. 1 is a pictorial view of an improved heat-sink attachment in operative heat-dissipating clasping relationship to a miniature circuit module; the latter being designated by dashed linework;

FIG. 2 portrays the attachment of FIG. 1 alone, and as viewed from the opposite end;

FIG. 3 is an end view of the heat sink of FIG. 2, looking toward the right-hand end thereof;

FIG. 4 is an end view of the heat sink of FIG. 2, looking toward the left-hand end thereof;

FIG. 5A is a side view of the heat sink, as shown in FIG. 1 but on a reduced scale, as it is being opened to admit a miniature circuit module which is in the process of being inserted;

FIG. 5B is a side view of the same heat sink, on the same reduced scale, with the circuit module inserted about mid-way; and FIG. 5C is a side view of the same heat sink, on the same scale as in FIGS. 1-4, with the circuit module fully inserted.

DETAILED DESCRIPTION OF THE PREFERRED EMBODIMENTS

Having reference to the drawings, wherein like reference characters designate identical or corresponding parts throughout the different views, and more particularly to FIG. 1 thereof, one embodiment of an improved heat-sinking arrangement, 6, is shown, via dashed linework, in a cooperative mated relationship with a multi-terminal microcircuit module 7, of the dual-in-line package (DIP) type having terminals 7A depending from opposite sides of its thin rectangular-parallelepiped molded plastic body. As is well known, such elongated electronics packages may contain devices, multiple components, and/or integrated circuitry, with fewer or more than the illustrated number of pins or terminals. Generally, the lower surface of such a package is likely to exhibit the greater temperatures, unless cooled, because of the presence nearby of a lower substrate on which various internal active components are mounted in common. Such packages are manufactured in lines of essentially standard widths and heights, with lengths and numbers of pins varying according to the needs of what is being packaged; however, the heights of even such standardized plastic cases can vary as much as 0.03 inch for units having cross-sections of about $\frac{1}{8} \times \frac{1}{4}$ inch, and that variation must be accommodated by a heat-sinking arrangement which fits over the case.

Importantly, the stamped sheet-metal heat-sinking arrangement 6 has two elongated, substantially flat, and normally-parallel members, 6A and 6B, which are disposed to engage with and make intimate broad-area contacts with the flat upper and lower surfaces, respectively, of the module or package 7. The metal of the stamping should be of sufficient resilience or elasticity to act as enough of a spring, in a unit having the illustrated configuration and relative proportions, for the members 6A and 6B to clasp and hold themselves in firm abutting relationships with those upper and lower surfaces of the module. Aluminum stock can even serve those purposes, for example, and functions as an excellent conductor of the package heat which must be withdrawn and brought to the third member, 6C, for convective dissipation promoted by its radiating fins 6D. Thin lower member 6B (example: just over 1/64 inch) takes up very little room beneath the module, and is readily fitted there within the space normally allotted between the module and a printedcircuit board onto which it is held when its pins are socketed through apertures and wave-soldered into connections with various conductors. Except for its fins 6D, a typical heat sink such as that shown (FIG. 2) may measure generally about $\frac{1}{4}$ inch in width, 6E, $\frac{7}{8}$ inch in overall length, 6F, and $\frac{1}{4}$ inch in basic height, 6G, and the said lower member 6B, is intentionally made somewhat narrower (example: just over 3/16 inch) so that it will not be likely to interfere with the somewhat wider-spread rows of delicate pins 7A of an associated module. However, upper member 6A is of a width fully spanning the width of such a module and, in addition, has short downwardly-turned overhanging edges, 6A' and 6A", which help to form a shallow channel for guidance of the module as it is being inserted and for improved lateral holding and centering of the module once it is in place.

The upper and lower clasp members, 6A and 6B, are integral with the intermediate heat-radiating member 6C, each being separately cantilevered from a different end of that middle member. Their respective end connections, 6H and 6I, are of different lengths, allowing the two clasp members to extend freely in opposite directions in spaced and nearby parallel relationship. Preferably, those clasp members are initially biased so that they slope slightly toward one another in direction of their open end 6J; such slight inclination tends to promote settlement of the members into good broad-area contacts with upper and lower surfaces of a module inserted between them. Importantly, each of the two members conducts heat away from the module wholly independently of the other, via their end connections 6H and 6I, and to opposite ends of the elongated heat-radiating member 6C. This arrangement is particularly advantageous in that the heat being conducted away from the lower surface of the module to the radiating fins does not have to travel first across the upper surface, where it could interfere with the efficient cooling which should also be taking place there as well. A simple clasp in which the upper and lower members are joined directly would not offer that distinct advantage and significant improvement.

Heat dissipation from the unit is effected mainly by convective cooling achieved by intermediate member 6C, and, when good thermal matching to the ambient atmosphere is realized through use of fins 6D, or the equivalent, there is little likelihood that heat from one of the clasp members can be deleteriously conducted back to an associated module through the other. That is true even if connection 6H is disposed not at the narrower end of the radiating member but alongside it. In lieu of the illustrated fins, there may instead be other provisions for establishing good thermal matching, and heat transfer, between member 6C and the ambient, such as perforations, ribbon-like or twisted sections of material, tabs, etc.

As is represented in FIG. 5A, a module, 7, is inserted into the heat-sink unit 6 from one narrower end thereof, namely via the aforementioned end opening 6J. An end of the module is first wedged between the free end of lower clasp member 6B and the nearby connection end of stiffer upper clasp member 6A, deflecting the member 6B downwardly. Thereafter, when the module is pressed further into the module, such as to about two-thirds of the way in (FIG. 5B), the upper clasp member is also leveraged to deflect appreciably, upwardly as shown. Ultimately, when the module is in its fully-inserted position (FIG. 5C), both the upper and lower clasp members should lie substantially flat against the parallel upper and lower surfaces of the module, for efficient conductive transfers of heat away from those surfaces. A downwardly-extending detent or catch, 8, near the connection end of upper member 6A, helps to lock the module in place, and a stop 9 near the innermost end of the module-receiving space makes small-area contact with the module as it keeps it isolated from heat travelling through end connection 6I.

Modules of various lengths and having different numbers of terminals may be accommodated, by lengthening or shortening the members which form the three section heat sink. Also the entire unit may be scaled in overall size to operate with modules or other packages, with or without dual-in-line rows of pins, of different size and construction from that which has been chosen for illustration. Although end connection 6H has been shown as a short element, it may be a folded-back longer section, nested between the upper clasp member and the heat-radiating member and affording further flexibility because of that augmented length of connection. Also, the upper clasp member may be formed with heat-radiating fins or the like extending from ends of its channel flanges 6A' and 6A": It should therefore be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What we claim as new and desire to secure by Letters Patent of the United States is:

1. One-piece heat-sink apparatus for a dual-in-line pin (DIP) electronics package the body of which has the general form of a thin elongated rectangular parallelepiped with pin terminals depending from opposite sides thereof, comprising a first elongated thin and flat sheet-metal heat-transfer clasp element proportioned to abut closely and substantially coextensively directly under and against the lower surface of the package, said first clasp element being no wider than the body of the electronics package and thereby allowing dual-in-line pin terminals of the body to project downwardly therefrom without interference from said first clasp element, a second elongated heat-transfer clasp element of the same thin sheet metal disposed in substantially parallel spaced alignment with said first clasp element for direct engagement with the upper surface of the package, a third elongated heat-radiating element of the same sheet metal disposed in spaced substantially parallel and coextensive alignment with said first and second clasp elements and having heat-radiating projections exposed to the ambient atmosphere for release of heat thereto, first connection means integral with one end of each of said first clasp element and third heat-radiating element and holding said first clasp elements in spaced substantially parallel alignment with one side of said third heat-radiating element at a first distance therefrom, and second connection means integral with one end of said second clasp element and the end of said third heat-radiating element opposite the said one end thereof and holding said second clasp element and third heat-radiating element in a spaced substantially parallel alignment with said one side of said third heat-radiating element at a second distance therefrom which is less than said first distance, said first and second clasp elements having their free ends extending in opposite directions from their integral cantilevered connections with said third heat-radiating element by way of said first and second connection means, whereby the body of such a package may be admitted into the space between the free end of said first clasp element and the nearby second clasp element and slid into a nested position therebetween, with the downwardly-projecting pin terminals of the body straddling said first clasp element, for conduction of its internally-generated heat independently and directly through said end connection means to said third heat-radiating element for convective dissipation therefrom.

* * * * *